United States Patent [19]

Jean

[11] Patent Number: 5,786,288

[45] Date of Patent: Jul. 28, 1998

[54] LOW DIELECTRIC CERAMIC COMPOSITIONS FOR MULTILAYER CERAMIC PACKAGE

[75] Inventor: Jau-Ho Jean, Hsin Chu, Taiwan

[73] Assignee: National Science Council, Taipei, Taiwan

[21] Appl. No.: 760,300

[22] Filed: Dec. 4, 1996

[51] Int. Cl.$^6$ .................... C03C 4/16; C03C 10/08
[52] U.S. Cl. ..................... 501/16; 501/6; 501/9; 501/21; 428/433; 428/901
[58] Field of Search ................ 501/6, 9, 16, 21, 501/66, 69, 70, 65; 428/209, 433, 427, 428, 901; 174/256, 257; 427/96

[56] References Cited

U.S. PATENT DOCUMENTS

| | | | |
|---|---|---|---|
| 3,926,648 | 12/1975 | Miller | 106/39.6 |
| 4,301,324 | 11/1981 | Kumar et al. | 174/156 |
| 4,627,160 | 12/1986 | Herron et al. | 29/830 |
| 4,642,148 | 2/1987 | Kurihara et al. | 156/89 |
| 4,672,152 | 6/1987 | Shinohara et al. | 174/68.5 |
| 4,749,665 | 6/1988 | Yano et al. | 501/32 |
| 4,752,531 | 6/1988 | Steinberg | 501/20 |
| 4,755,490 | 7/1988 | DiLazzaro | 501/17 |
| 4,788,064 | 11/1988 | Patel et al. | 424/444 |
| 4,879,261 | 11/1989 | Burn | 501/32 |
| 5,024,975 | 6/1991 | Hartmann | 501/32 |
| 5,070,046 | 12/1991 | Hu | 501/9 |
| 5,145,540 | 9/1992 | Foley et al. | 501/32 |
| 5,206,190 | 4/1993 | Jean et al. | 501/32 |
| 5,264,399 | 11/1993 | Casey et al. | 501/17 |
| 5,283,210 | 2/1994 | Kata et al. | 501/32 |
| 5,532,194 | 7/1996 | Kawashima et al. | 501/9 |

FOREIGN PATENT DOCUMENTS 80105407  11/1995  China.

*Primary Examiner*—Michale Marchesohi
*Attorney, Agent, or Firm*—McDonnell Boehnen Hulbert & Berghoff

[57] ABSTRACT

A crystallizable ceramic composition for forming a ceramic dielectric body having a dielectric constant in the range of 4.8–5.3 at 1 MHz and a linear thermal expansion coefficient of $4.0–5.1 \times 10^{-6} K^{-1}$ in the temperature range of 25°–200° C. The dielectric composition comprises a mixture of finely divided particles of 10–90 wt % Mg-Al-Si glass and 10–90 wt % Ca-Al-B-Si glass. The dielectric composition can be used with organic solvents, polymeric binder and plasticizer to produce an unfired green tape which is cofirable with high electrical conductivity metallurgies such as gold, silver, silver-palladium and copper.

11 Claims, No Drawings

LOW DIELECTRIC CERAMIC COMPOSITIONS FOR MULTILAYER CERAMIC PACKAGE

TECHNICAL FIELD

The invention relates to dielectric ceramic materials and particularly to dielectric substrate materials useful in multilayer ceramic packages. The dielectric ceramic compositions of the invention are sintered and crystallized at low temperatures and have a low dielectric constant and a low linear thermal expansion coefficient.

BACKGROUND OF INVENTION

Aluminum oxide is widely used in conventional multilayer ceramic packages because of its excellent electrical insulating properties, chemical inertness, and suitable mechanical strength and thermal conductivity. Package substrates using aluminum oxide as basic material generally comprise 4–10 wt % glass and have a sintering temperature higher than 1600° C. Thus conductors having a high melting point and a high electrical resistance such as tungsten and molybdenum are required, with co-firing in a hydrogen atmosphere.

The current trend is for electrical is packages to be designed for smaller size, higher performance, higher density and higher speed. Since aluminum oxide has a high dielectric constant of about 10, signal transmission delay, signal distortion and noise easily occur in high performance package substrates using aluminum oxide. The correlation equation between the signal transmission delay (t) in the package substrate and the dielectric constant of the package substrate (k') is as follows:

$$t = \frac{\sqrt{k'}}{C}$$

Where C indicates the speed of light. It is known from the above equation that a decrease of the dielectric constant of the package substrate significantly reduces the signal transmission delay. For example, a decrease of the dielectric constant from 10 to 5 results in the reduction of signal transmission delay by 30%. In addition, since the linear thermal expansion coefficient of aluminum oxide ($7.4\times10^{-6}K^{-1}$) is much higher than that of silicon chips ($3\times10^{-6}K^{-1}$), there are potential physical reliability problems in the use of these materials in the same packages.

Thick film screen printing technique is commonly used in the preparation of multilayer ceramic packages. The preparation process comprises screen printing conductor circuits on a fired ceramic substrate (normally a substrate having 96% aluminum oxide), firing once, screen printing another layer of dielectrics, firing again and repeating the whole process until the desired number of layers is obtained. The process is complicated, time-consuming and it is difficult to control the thickness of layers, and thus is not widely used in the industry.

However, the instant invention teaches thick film screen printing technique and aluminum oxide multilayer package technique to develop multilayer ceramic packages having a low sintering temperature and a low dielectric constant overcoming the limitations mentioned above. The ceramic package of the instant invention can be sintered at a temperature in the range of 800°–1000° C. and therefore can be co-fired to shape with conductors having a low melting point and a low electrical resistance, such as gold and silver in an air atmosphere. The process of the instant invention is much easier than the conventional thick film screen printing technique and aluminum oxide multilayer package technique. In addition, since multilayer ceramic substrates sintered at a low temperature have a lower dielectric constant (4–8) and a lower linear thermal expansion coefficient ($2-6\times10^{-6}K^{-1}$), the signal transmission delay in multilayer ceramic substrates of the instant invention is reduced and the reliability of the entire package in use is improved.

The invention provides multilayer ceramic substrate compositions having a low sintering temperature and a low dielectric constant, sintered at a temperature in the range of 800°–1000° C. and which becomes dense in a period of 10–60 minutes. The sintering process is compatible with conventional thick film process and conventional equipment can be utilized.

U.S. Pat. No. 4,642,148 describes a ceramic composition comprising 10–75 wt % alpha-alumina, 5–70 wt % non-crystalline quartz, 20–60 wt % borosilicate glass. The dielectric system has a dielectric constant in the range of 4.8–9.6.

U.S. Pat. No. 4,672,152 describes a ceramic composition comprising 50–95 wt % crystallizable glass and 5–50 wt % ceramic filler. The dielectric system has a dielectric constant in the range of 5.1–6.0. The crystallizable glass consists of 5–20 wt % lithium oxide, 60–90 wt % silicon dioxide, 1–10 wt % aluminum oxide, and 1–5 wt % alkaline metal oxide other than lithium oxide. The ceramic filler includes silicon dioxide and aluminum oxide.

U.S. Pat. No. 3,926,648 describes a ceramic composition consisting of crystallizable glass only. The glass forms cordierite as the crystalline phase and has a dielectric constant of 5.2 and a linear thermal expansion coefficient of $1-2\times10^{-6}K^{-1}$.

U.S. Pat. No. 4,755,490 describes a ceramic composition comprising 10–50 wt % alumina, 0–30 wt % fused silica, and 50–60 wt % of a frit comprised of 4 wt % CaO, 12 wt % MgO, 29 wt % $B_2O_3$ and 42 wt % $SiO_2$. The dielectric composition has a sintering temperature below 1000° C., a dielectric constant in the range of 4.5–6.1, and a linear thermal expansion coefficient in the range of $3.9-4.2\times10^{-6}K^{-1}$.

U.S. Pat. No. 4,788,046 describes a ceramic composition comprising quartz and glass. To increase the density of the dielectric system, quartz powder is coated with a layer of glass and then mixed with glass powder. The dielectric material has a dielectric constant of 4.5 and a linear thermal expansion coefficient larger than $5.5\times10^{-6}K^{-1}$.

U.S. Pat. No. 4,879,261 describes a ceramic composition comprising 70–85 wt % silica and 15–30 wt % zinc borate flux. The dielectric system has a sintering temperature below 1065° C. and a dielectric constant in the range of 5–5.5.

R.O.C. Patent Publication No. 259,924 describes a ceramic composition comprising 45–70 wt % borosilicate glass and 30–55 wt % filler. The borosilicate glass comprises 60–80 wt % silica, 15–30 wt % boron oxide, 0.5–1.5 wt % aluminum oxide and 0.5–3 wt % alkaline metal oxide. The filler includes aluminum oxide, magnesium olivine, quartz, non-crystalline silica, aluminum rich andalusite, cordierite, boron nitride and aluminum nitride. The system has a sintering temperature below 1000° C. and a dielectric constant in the range of 4.5–5.5.

SUMMARY OF THE INVENTION

The instant invention provides a dielectric composition sintered at low 5 temperatures which has a dielectric constant of about 5.5 and a linear thermal expansion coefficient compatible with silicon chips.

The invention also provides a dielectric composition which can be sintered at a low temperature in a short period of time. In a preferred embodiment, the dielectric composition of the instant invention can reach a sintered density higher than 95% at 800°–1000° C. within a period of 10–60 minutes.

DETAILED DESCRIPTION OF THE INVENTION

The invention relates to a dielectric composition which comprises two kinds of crystallizable glass, Mg-Al-Si glass and Ca-Al-B-Si glass. The ratio of the two kinds of glass is not particularly limited, and can vary depending on the required properties of the product. A preferred ratio is 10–90 wt % Mg-Al-Si glass and 10–90 wt % Ca-Al-B-Si glass. Being sintered at a low temperature (800°–1000° C.) for a period of 10–60 minutes, the glass mixture not only reaches 95 % densification but also forms crystalline cordierite and calcium feldspar as the crystal phase. The dielectric composition of the invention has a dielectric constant in the range of 4.8–5.3 at 1 MHz and a linear thermal expansion coefficient of $4.0–5.1 \times 10^{-6} K^{-1}$ in the temperature range of 25°–200° C.

The term "crystalline glass" as used herein is defined to encompass non-crystalline glass such as Mg-Al-Si glass and Ca-Al-B-Si glass being sintered at a temperature in the range of 800°–1000° C. to form a crystalline phase. In a preferred embodiment, the Mg-Al-Si glass comprises 15–25 wt % magnesium oxide, 20–30 wt % aluminum oxide and 40–60 wt % silicon oxide. In a preferred embodiment, the Ca-Al-B-Si glass comprises 15–25 wt % calcium oxide, 15–25 wt % aluminum oxide, 5–15 wt % boron oxide and 40–60 wt % silicon oxide.

The dielectric composition of the invention is useful in multilayer ceramic packages. For the preparation of multilayer ceramic packages, the crystalline glass mixture of the invention can be mixed with organic solvents such as toluene and ethanol, polymeric binder such as polyvinyl butyral (PVB) and plasticizer such as dibutyl phthalate (DBP) to produce a paste which can be further shaped into an unfired green tape, and the unfired green tape can be screen printed with an electrical conductive paste such as gold and silver, stacked, compressed and co-fired to produce multilayer ceramic packages. One of skill in the art will recognize that other suitable pastes can be produced using the compositions of the instant invention.

Therefore, the invention provides a paste for use in the shaping process which comprises in a preferred embodiment:

(a) 70–85 wt % glass powder comprising 10–90 wt % Mg-Al-Si glass and 10–90 wt % Ca-Al-B-Si glass; and (b) 15–30 wt % organic carrier including organic solvent, polymeric binder and plasticizer.

The invention also provides a process for producing a ceramic product having a low dielectric constant which comprises:

(a) mixing two kinds of glass powder, 10–90 wt % Mg-Al-Si glass and 10–90 wt % Ca-Al-B-Si glass; and (b) sintering the composition at a temperature lower than 1000° C. in an air atmosphere.

The invention further provides a process for preparing a multilayer ceramic package which comprises screen printing on a glass unfired green tape, a circuit of conductor having a low melting point and a low electrical resistance such as gold and silver, filling and extruding, stacking and compressing into unfired multilayer ceramics, and finally defatting and co-firing the multilayer ceramics in an air atmosphere for densification, which process is characterized in that the glass comprises:

(a) 10–90 wt % Mg-Al-Si glass; and (b) 10–90 wt % Ca-Al-B-Si glass.

The following examples further illustrate the invention but are not intended in any way to limit the scope of the invention. If can be recognized that many substitutions and modifications can be made by those skilled in the art and are still within the spirit and scope of the instant invention.

EXAMPLES

Example 1

Two kinds of crystalline glass powder were respectively ball milled in a 4-liter roller with aluminum oxide milling ball for 24 hours to produce fine glass powders having average diameter of approximately 2–3 microns. 30 wt % Mg-Al-Si glass and 70 wt % Ca-Al-B-Si glass were mixed and then mixed with 5 wt % polyethylene glycol (PEG) and 50 wt % n-propanol using a three dimensional long-arm mixer for 2 hours. The well mixed paste was dried, sieved to obtain dry powder and then compressed under 13000 psi to produce unfired green tape of 0.3 cm height and 1.3 cm diameter. The prepared unfired green tape was split into three groups, which were sintered at 875° C. for 15 (1A), 30 (1B) and 60 (1C) minutes respectively. The sintering process included two stages. The first stage was defatting. The unfired green tape was heated at a 5° C./minute heating rate to slowly remove the organic binders within the unfired green tape and the temperature was maintained at 500° C. for 1 hour to ensure complete removal. In the second stage, the temperature was increased from 500° C. to 875° C. at a heating rate of 5° C./minute and maintained at 875° C. for 15–60 minutes for sintering.

The density of sintered bodies was determined according to the Archimedean principle. The data obtained in the example are shown in Table 1. All three different sintering time durations obtained a relative sintered density higher than 97%. The results were further verified by scanning electron micrographs of the cross-section of the sintered bodies.

X-ray diffraction analysis showed that the sintered bodies have calcium feldspar and cordierite as crystalline phase, the strength of which was also shown in Table 1. The amount of calcium feldspar crystals was significantly increased with the extension of sintering time. The dielectric constant (k') and loss (k") were determined with HP-4192 AC Resistance Meter at 1 MHz. The results were also shown in Table 1. Linear thermal expansion coefficient (CTE) was determined with Thermal Mechanical Analyzer (TMA). The CTE values shown in Table 1 were averages of the data obtained at 25°–200° C.

Example 2

The preparation process and determination procedures were all similar to those described in Example 1 except that 50 wt % Mg-Al-Si glass and 50 wt % Ca-Al-B-Si glass were used. The prepared unfired green tape was split into three groups, which were sintered at 875° C. for 15 (2A), 30 (2B) and 60 (2C) minutes respectively. The sintered density, crystal amount, dielectric constant and thermal expansion results are shown in Table 1.

Example 3

The preparation process and determination procedures were similar to those described in Example 1 except that 20 wt % Mg-Al-Si glass and 80 wt % Ca-Al-B-Si glass were used. The prepared unfired green tape was split into three groups, which were sintered at 875° C. for 15 (3A), 30 (3B) and 60 (3C) minutes respectively. The sintered density, crystal amount, dielectric constant and thermal expansion results are shown in table 1.

TABLE 1

| Example No | Relative Density (%) | Cordierite (110) (CPS) | Calcium felds par (004) (CPS) | Dielectric Constant (@ 1 MHz) | Dielectric Loss (@ 1 MHz) | CTE ($\times 10^{-6} K^{-1}$) |
|---|---|---|---|---|---|---|
| 1A | 0.98 | 0 | 212 | 5.22 | 0.0009 | 4.17 |
| 1B | 0.99 | 0 | 296 | 5.18 | 0.0006 | 4.01 |
| 1C | 0.99 | 241 | 418 | 5.17 | 0.0004 | 4.29 |
| 2A | 0.98 | 0 | 263 | 5.11 | 0.0007 | 4.12 |
| 2B | 0.99 | 0 | 403 | 5.02 | 0.0005 | 4.02 |
| 2C | 0.99 | 0 | 498 | 4.94 | 0.0001 | 4.48 |
| 3A | 0.97 | 0 | 185 | 5.01 | 0.0004 | 5.02 |
| 3B | 0.97 | 0 | 309 | 4.91 | 0.0003 | 4.96 |
| 3C | 0.97 | 0 | 386 | 4.82 | 0.0004 | 5.08 |

In the above three examples, all the dielectric compositions can be sintered to a relative density higher than 97% at a low temperature (about 875° C.) for a short period of time (15–60 minutes) in air atmosphere. Since the sintering temperature required for achieving high density is compatible with low melting point, low electrical resistance conductor such as gold and silver, all the exemplified dielectric compositions can be co-fired with gold or silver conductors. In addition, all the exemplified dielectric compositions have a low dielectric constant (4.8–5.3) and a low linear thermal expansion coefficient (4.0–5.1×10$^{-6}$K$^{-1}$) and significantly reduce the signal transmission delay in the ceramic substrates and improve the reliability of the entire package in use.

In the above three examples, all the dielectric compositions can be co-fired with low melting point, low electrical resistance conductors such as gold and silver to produce multilayer ceramic packages. For the preparation of multilayer ceramic packages, the crystalline glass components are mixed with organic solvents such as toluene and ethanol, polymeric binders such as polyvinyl butyral (PVB) and plasticizers such as dibutyl phthalate (DBP) to produce a paste which is further shaped into an unfired green tape having a thickness of 125 microns. The unfired green tape can be cut to 10×10 cm in size, punched with Dies of 125 microns diameter and screen printed and filled with an electrical conductive paste such as gold and silver. The screen printed and filled unfired green tape is successively stacked and compressed at a temperature in the range of 60°–100° C. under 1000–3000psi to produce unfired bodies. Finally, the unfired multilayer ceramic bodies are defatted and co-fired in an air atmosphere for sintering.

The dielectric compositions of the instant invention can also form ceramic bodies of various shape and utility by conventional processes such as dry pressing, cold pressing and hot pressing. Taking dry pressing as an example, glass powder may be mixed with water and binders such as polyvinyl alcohol (PVA), spray dried and granulated to improve the fluidity of the powders, and then dry compressed, defatted and sintered to produce low dielectric ceramic products.

We claim:

1. A dielectric composition which comprises:
   (a) 10–90 wt % Mg-Al-Si glass which forms crystalline cordierite after sintering; and
   (b) 10–90 wt % Ca-Al-B-Si glass which forms crystalline calcium feldspar after sintering.

2. A dielectric composition of claim 1 wherein the Mg-Al-Si glass comprises 15–25 wt % magnesium oxide, 20–30 wt % aluminum oxide, and 40–60 wt % silicon oxide.

3. A dielectric composition of claim 1 wherein the Ca-Al-B-Si glass comprises 15–25 wt % calcium oxide, 15–25 wt % aluminum oxide, 5–15 wt % boron oxide and 40–60 wt % silicon oxide.

4. A dielectric composition of claim 1 which has a dielectric constant in the range of 4.8–5.3 at 1 MHz and a linear thermal expansion coefficient of 4.0–5.1×10$^{-6}$K$^{-1}$ in the range of 25°–200° C.

5. A paste for use in a process for shaping ceramic dielectric components, said paste comprising:
   (a) 70–85 wt % glass powder comprising 10–90 wt % Mg-Al-Si glass and 10–90 wt % Ca-Al-B-Si glass, wherein said glass powder forms crystalline cordierite and calcium feldspar after sintering; and
   (b) 15–30 wt % organic carrier comprising an organic solvent, a polymeric binder and a plasticizer.

6. A process for producing a ceramic product having a dielectric constant less than 6 at 1 MHz which comprises:
   (a) mixing 10–90 wt % Mg-Al-Si glass powder and 10–90 wt % Ca-Al-B-Si glass powder; wherein said glass powder forms crystalline cordierite and calcium feldspar after sintering;
   (b) mixing said mixed glass powders with an organic carrier to form a paste; said organic carrier being 15–30 wt % of said paste, and said organic carrier comprising an organic solvent, a polymeric binder and a plasticizer;
   (c) forming said paste into an unfired green tape and shaping;
   (d) sintering the unfired green tape at a temperature lower than 1000° C. in an air atmosphere.

7. The process of claim 6 wherein the Mg-Al-Si glass powder comprises 15–25 wt % magnesium oxide, 20–30 wt % aluminum oxide and 40–60 wt % silicon oxide.

8. The process of claim 6 wherein the Ca-Al-B-Si glass powder comprises 15–25 wt % calcium oxide, 15–25 wt % aluminum oxide, 5–15 wt % boron oxide and 40–60 wt % silicon oxide.

9. A process for preparing multilayer ceramic package from an unfired green tape, wherein said process comprises screen printing on a glass unfired green tape, a circuit of conductor having a melting point and a electrical resistance comparable to that of gold and silver, filling and extruding the unfired green tape into shapes, stacking and compressing the unfired green tape into unfired multilayer ceramic packages, removing organic binder, and co-firing the unfired multilayer ceramic packages in an air atmosphere wherein said glass unfired green tape comprises:

(a) 10–90 wt % Mg-Al-Si glass which forms crystalline cordierite after sintering; and (b) 10–90 wt % Ca-Al-B-Si glass which forms crystalline calcium feldspar after sintering.

10. The process of claim 9 wherein the Mg-Al-Si glass comprises 15–25 wt % magnesium oxide, 20–30 wt % aluminum oxide and 40–60 wt % silicon oxide.

11. The process of claim 9 wherein the Ca-Al-B-Si glass comprises 15–25 wt % calcium oxide, 15–25 wt % aluminum oxide, 5–15 wt % boron oxide and 40–60 wt % silicon oxide.

* * * * *